United States Patent [19]

Kumabe

[11] Patent Number: 4,750,184
[45] Date of Patent: Jun. 7, 1988

[54] SEMICONDUCTOR LASER DEVICE OF REFRACTIVE INDEX GUIDE TYPE

[75] Inventor: Hisao Kumabe, Itamishi, Japan
[73] Assignee: Mitsubishi Denki K.K., Tokyo, Japan
[21] Appl. No.: 30,897
[22] Filed: Mar. 25, 1987
[30] Foreign Application Priority Data

Jun. 27, 1986 [JP] Japan .................... 61-151958

[51] Int. Cl.$^4$ .................................... H01S 3/19
[52] U.S. Cl. ............................ 372/45; 357/16; 357/17; 372/46
[58] Field of Search .................... 372/44–46; 357/16, 17

[56] References Cited

FOREIGN PATENT DOCUMENTS 0258988 12/1985 Japan ........................ 372/46

OTHER PUBLICATIONS

Y. Mihashi, Y. Nagai, Y. Seiwa, T. Aoyagi, T. Kadowaki, K. Ikeda and W. Susaki, "A Novel Self-Aligned AlGaAs Laser with Bent Active Layer Grown by MOCVD", Dec. 1985, IEDM, pp. 646–649.

*Primary Examiner*—James W. Davie
*Attorney, Agent, or Firm*—Yusuke Takeuchi

[57] ABSTRACT

A semiconductor laser device comprises a semiconductor substrate of the first conductive type, with a groove, the width of the bottom of which is greater than that of the top, a current blocking layer of the second conducting type, formed on said semiconductor substrate discontinuously at both sidewalls of said groove, a lower side cladding layer of the first conductive type for covering said current blocking layer and the sidewalls of said groove, an active layer formed on said lower side cladding layer and having an band gap smaller than that of said lower side cladding layer and a large refractive index, an upper side cladding layer of the second conductive type formed on said active layer and having an band gap greater than that of the active layer and a small refractive index, and a contact layer of the second conductive type formed on said upper cladding layer so that it is possible to easily grow a high quality crystal repeatedly with merely one crystal growth process and that the laser device has a stable fundamental transverse-mode operation, a low threshold current and small astigmatisms.

5 Claims, 1 Drawing Sheet

SEMICONDUCTOR LASER DEVICE OF REFRACTIVE INDEX GUIDE TYPE

BACKGROUND OF THE INVENTION

1. Field of the Invention

The present invention relates to light sources for use in optical communication and optical information systems, more specifically to a semiconductor laser device of the refractive index guide type, operating with a low threshold current and stable fundamental transverse-mode.

2. Description of the Prior Art

FIG. 2. shows in cross section an example of an AlGaAs semiconductor laser device's structure according to the prior art.

In the first growth step a p-type $Al_yGa_{1-y}As$ cladding layer 12 and an n-type GaAs current blocking layer 13 are grown on top of a p-type GaAs substrate 11 using the MOCVD method. An inverted trapezoidal groove 14 is formed by selectively etching into one section of the n-type GaAs current blocking layer 13. Next, in the second growth step, a p-type $Al_yGa_{1-y}As$ cladding layer 15, an $Al_xGa_{1-x}As$ active layer 16 with an active region 21, an n-type $Al_xGa_{1-y}As$ cladding layer 17, and an n-type GaAs contact layer 18 are grown successively. 19 is a negative electrode; 20 is a positive electrode.

In order to cause laser oscillation it is necessary to apply a forward voltage between the negative electrode 19 and positive electrode 20, and also to cause in the acative region 21 a forward current flow greater than the threshold value. In a semiconductor laser device of this structure, the current path is restricted near the groove 14 and the current is made to converge in the active region 21 by means of the n-type GaAs blocking layer 13. In addition to the double heterojunction in the vertical direction, the $Al_xGa_{1-x}As$ active layer 16 is bent to have a refractive index distribution in the horizontal direction. As a result of these special features, the electric current, carriers, and light are efficiently confined almost completely in the active region.

This semiconductor laser device has excellent performance: the low oscillation threshold current being approximately 30 mA for room temperature CW operation for example, stable fundamental transverse-mode operation in temperatures over 90° C., smoothly shaped emlssion pattern, and small astigmatisms. The above mentioned semiconductor laser device according to the prior art is impossible to make unless the said crystal growth process is carried out in the aforementioned order. In other words, in the first growth step, after the p-type $Al_yGa_{1-y}$ As cladding layer 12 and the n-type GaAs blocking layer 13 are grown, the crystal is taken out of the growth furnace. Then the growth of the groove 14 that becomes the current path is carried out. Then the layers from the p-type $Al_yGa_{1-y}$ As cladding layer 15 to the n-type GaAs contact layer 18 are grown successively. The wafer is therefore exposed to the air once while being manufactured. At that time, the crystal surfaces exposed to the oxygen and moisture carrying atmosphere naturally begin to oxidize and deteriorate. Because during the time of the second growth step, an inferlor growth is established, it is not possible to grow a high quality crystal and it becomes very difficult to reproducibly realize excellently performing semiconductor laser devices. In order to solve this, usually, right before the second growth step, the crystal is etched to eliminate the oxidation layer and the like, cleaning the crystal surfaces. However, it is so difficult to clean perfectly that even using the comparatively easy MOCVD method frequently creates problems.

Not just limited to the shown example structure, but with almost all the semiconductor laser device structures having a blocking layer and a refractive index guide, whether using MOCVD or LPE crystal growth methods, it is necessary to carry out a second qrowth step. The main problem point is that the reproducibility of this semiconductor laser device with outstanding qualities has been very low.

SUMMARY OF THE INVENTION

It is the primary object of the present invention to provide a semiconductor laser device that can be manufactured from the wafer in one crystal growth step without exposing it to the air and has a stable fundamental transverse-mode operation and a low threshold value among other outstanding reproducible qualities.

According to the present invention there is provided a semiconductor laser device comprising a semiconductor substrate of the first conductive type, with a groove, the width of the bottom of which is greater than that of the top, a current blocking layer of the second conducting type, formed on said semiconductor substrate discontinuously at both sidewalls of said groove, a lower side cladding layer of the first conductive type for covering said current blocking layer and the sidewalls of said groove, an active layer formed on said lower side cladding layer and having an band gap smaller than that of said lower side cladding layer and a large refractive index, an upper side cladding layer of the second conductive type formed on said active layer and having an band gap greater than that of the active layer and a small refractive index, and a contact layer of the second conductive type formed on said upper cladding layer.

In this invention, the active layer formed inside the groove becomes the active region, the side walls of the said groove where the blocking layer has not been formed become the electric current path, and the light and carriers become concentrated in the active region.

Other and further object features and advantages of the invention will appear more fully from the following description in connection with the accompanying drawings.

BRIEF DESCRIPTION OF THE DRAWINGS

FIG. 1 is a p-type GaAs substrate, 2 is a trapezoidal groove, 3 is an n-type GaAs blocking layer, 4 is a p-type $Al_yGa_{1-y}As$ lower side cladding layer, 5 is a p-type $Al_xGa_{1-x}$ As active layer, 6 is an n-type $Al_yGa_{1-y}As$ upper side cladding layer, 7 is an n-type GaAs contact layer, 8 is a negative electrode, 9 is a positive electrode, 10 is an active region.

In each drawing, identical numerals correspond to equivalent parts.

DESCRIPTION OF THE PREFERRED EMBODIMENTS

Figure 1:
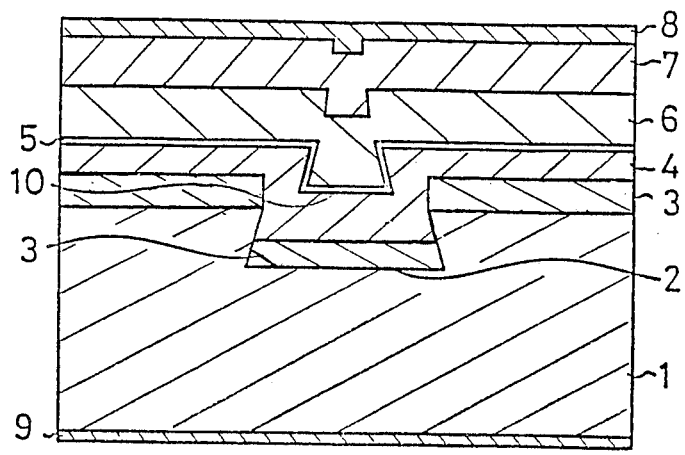
FIG. 1 is a cross-sectional diagram showing one practical example of the semiconductor laser device's structure according to the invention.
Figure 2:
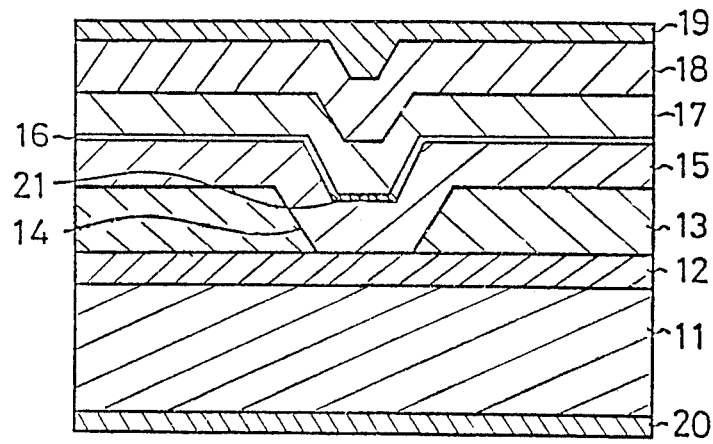
FIG. 2 is a cross-sectional diagram showing one example of an AlGaAs type semiconductor laser device's structure according to the prior art.

FIG. 1 is a cross sectioned view showing an example of one practical embodiment of the semiconductor laser device. In this figure, 1 is a p-type GaAs substrate (hereafter called substrate) and 2 is a groove, formed in one section of the substrate by using the common photoengraving and etching technologies. Using the MOCVD crystal growth technology, an n-type GaAs current blocking layer 3 is formed on the substrate surface and discontinuously in the groove 2 such that the substrate is exposed on the side walls of the trapezoidal groove 2. A p-type $Al_yGa_{1-y}As$ lower side cladding layer 4 is formed in such a way as to cover all of the above-mentioned groove 2 and the n-type GaAs blocking layer 3 surface. The p-type $Al_yGa_{1-y}As$ lower side cladding layer 4 is formed, bending along the shape of the trapezoidal qroove 2 ($y > x$). 10 is the active region of a p-type $Al_xGa_{1-x}As$ active layer 5. An n-type $Al_yGa_{1-y}As$ upper side cladding layer 6 is formed on the above-mentioned p-type $Al_xGa_{1-x}As$ layer 5. On this, an n-type GaAs contact layer 7 is formed. 8 is a negative electrode; 9 is a positive electrode.

In this semiconductor laser device, when a forward voltage is applied between the negative electrode 8 and the positive electrode 9, a forward current between the two electrodes flows, crossinq the pn junction between the p-type $Al_xGa_{1-x}As$ active layer 5 and the n-type $Al_yGa_{1-y}As$ upper side cladding layer 6. On this occasion, with the action of the n-type GaAs blocking layer 3 grown discontinuously with the side walls of the trapezoidal groove 2 provided on the substrate, namely with the existence of an n-p-n opposite biased layer, the current is restricted only to the sides of the trapezoidal qroove 2, and is practically all concentrated in the active region 10.

The carriers pour into the active region 10 and light is emitted by the reunion of the electrons and holes. When the current is further increased, the harmonic vibrations inside the device are reflected, amplified, and if the current is brought up to the threshold value, laser emission occurs.

Incidentally, the p-type $Al_xGa_{1-x}As$ active layer 5 shown in FIG. 1 is bent on both sides of the active region 10 with the purpose of forming along the trapezoidal groove 2. The width and depth of the trapezoidal groove 2 as well as the thickness of the n-type GaAs current blocking layer 3, and p-type $Al_yGa_{1-y}As$ lower side cladding layer 4 are controlled to align the position and the width of the active region 10.

The active region 10 is joined at both sides to the low refractive index p-type $Al_yGa_{1-y}As$ lower side layer 4. The structure has a refractive index disparity in the widthwise direction. Due to the effectiveness of the adjacent band gap, the carriers and light are almost completely confined to the level active reglon 10. For that reason, the laser can be emitted with an extremely low threshold current as well as a stabilized fundamental transverse-mode operation. Because of the refractive index guide structure provided in the widthwise direction, it has excellent characteristics such as small astigmatisms. Furthermore, by example, if the trapezoidal groove 2 has a width of 4–5 $\mu$m and a depth of $\simeq 2$ $\mu$m, the thicknesses of the p-type $Al_yGa_{1-y}As$ lower side cladding layer 4 and the n-type GaAs current blocking layer 3 are $\simeq 1$ $\mu$m, the width of the active region becomes 2–3 $\mu$m, and the p-type $Al_xGa_{1-x}As$ active layer 5 has a thickness of $\simeq 0.1$ $\mu$m, it is possible to get a semiconductor laser device with the above-mentioned excellent special characteristics.

In the manufacturing process of this semiconductor laser device, first of all, the n-type GaAs blocking layer 3 is grown after forming the trapezoidal groove 2 in the substrate 1. In this case the n-type GaAs blocking layer 3 is not grown on the sidewalls of the trapezoidal groove 2, and this is later formed into the electric current path section. Henceforth, each layer from the p-type $Al_yGa_{1-y}As$ underside claddinq layer 4 to the n-type contact layer 7 can be grown successively, and it is not necessary to divide the crystal growth process into two steps like the prior art. It also is not necessary to form the electric current path groove by etching.

For this reason, the wafer is not exposed to the air during the crystal growth process as in the prior art. There is no fear that the wafer has oxidized, and it is possible to grow an excellent, stable crystal.

Although the p-type GaAs for the substrate 1 is used in the above mentioned embodiment, it is also possible to use n-type GaAs as the substrate 1. In this case, from the n-type GaAs blocking layer 3 down to the n-type GaAs contact layer 7, it is necessary to reverse each layer's conductive type, however the conductive type of the active layer may be eIther n- or p-type.

Without restrictions, it is possible to make the n-type GaAs blocking layer 3 with an $Al_xGa_{1-x}As$ layer. In the case where $x < z$, the absorption loss due to the blocking layer is reduced. Because of this, it is possible with high precision to reduce the thickness of the p-type $Al_yGa_{1-y}As$ lower side cladding layer 4 and control the width of the active region 10.

The laser structure shown in FIG. 1 is chosen as the basis. If between the $Al_xGa_{1-x}As$ active layer 5 and p-type $Al_yGa_{1-y}As$ lower side layer 4 or upper side layer (either the upper or the lower will do), an $Al_fGa_{1-f}As$ ($x < f < y$) guide layer having an AlAs mole ratio that is between the two layers is provided 1n the structure, the liqht spreads from the $Al_xGa_{1-x}As$ active layer 5 to the light guiding layer. The result is that the light density is reduced inside the $Al_xGa_{1-x}As$ active layer 5. Raising the output power is easily possible to practically make the laser output power greater.

Furthermore, this invention is not limited to AlaAs/GaAs system semiconductor laser devices. It is evident that with the same effectiveness, using other materials such as InGaAsP and AlGaInP systems in the semiconductor laser devices would be valid.

As disclosed above, a semiconductor laser device according to the invention comprises a semiconductor substrate of the first conductive type, with a groove, the width of the bottom of which is greater than that of the top, a current blocking layer of the second conducting type, formed on said semiconductor substrate discontinuously at both sidewalls of said groove, a lower side cladding layer of the first conductive type for covering said current blocking layer and the sidewalls of said groove, an active layer formed on said lower side cladding layer and having an band gap narrower than that of said lower side cladding layer and a large refractive index, an upper side cladding layer of the second conductive type formed on said active layer and having an band gap wider than that of the active layer and a small refractive index, and a contact layer of the second conductive type formed on said upper cladding layer so that it is possible to easily grow a high quality crystal repeatedly with merely one crystal growth process and that the laser device has a stable fundamental transverse-mode operation, a low threshold current and small astigmatisms.

Although the preferred embodiments of the present invention have been described above, other embodimenls and modifications which would seem apparent to one having originally skill in the art are intended to be covered by the spirit and scope of the appended claims.

What is claimed is:

1. A semiconductor device of a refractive index guide type in which a current blocking layer, a lower side cladding layer, and an active layer are formed in order on a semiconductor substrates with a stripe groove of a trapezoidal cross section, with the bottom width of said groove greater than its top width, characterized in that said cladding layer directly covers said blocking layer and both side walls of said groove so as to make direct contacts with said semiconductor substrate on said both side walls of said groove.

2. A semiconductor device according to claim 1 in which the active layer is narrower in forbidden band gap and greater in refractive index than the lower side cladding layer.

3. A semiconductor device according to claim 1 which further comprises an upper side cladding layer which is wider in forbidden band gap and smaller in refractive index than the active layer.

4. A semiconductor laser device according to claim 1, wherein said current blocking layer is formed by epitaxial growth technique.

5. In a semiconductor laser device of a refractive index guide type, which includes a semiconductor substrate of a first conductive type having on its first surface a groove, the width of the bottom of which is greater than that of the top, wherein the improvement comprises:

a current blocking layer of a second conducting type, formed on said semiconductor substrate discontinuously at both sidewalls of said groove so that said both sidewalls may be exposed;

a lower side cladding layer of said first conductive type for covering said current blocking layer and said exposed sidewalls of said groove so as to make direct contact with said semconductor substrate at said exposed sidewalls;

an active layer formed on said lower side cladding layer and having a first band gap narrower than that of said lower side cladding layer and a large refractive index; and an upper side cladding layer of said second conductive type formed on said active layer and having a second band gap wider than said first band gap and a small refractive index.

* * * * *